United States Patent
Park et al.

(10) Patent No.: US 9,911,531 B2
(45) Date of Patent: Mar. 6, 2018

(54) COMMON MODE FILTER AND METHOD OF MANUFACTURING THE SAME

(71) Applicant: SAMSUNG ELECTRO-MECHANICS CO., LTD., Suwon-Si, Gyeonggi-Do (KR)

(72) Inventors: Seung Wook Park, Suwon-Si (KR); Kwang Mo Kim, Suwon-Si (KR); Sang Moon Lee, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 174 days.

(21) Appl. No.: 14/931,828

(22) Filed: Nov. 3, 2015

(65) Prior Publication Data

US 2016/0218691 A1 Jul. 28, 2016

(30) Foreign Application Priority Data

Jan. 27, 2015 (KR) .......................... 10-2015-0012592

(51) Int. Cl.
*H01F 41/04* (2006.01)
*H03H 7/00* (2006.01)
(Continued)

(52) U.S. Cl.
CPC ......... *H01F 41/041* (2013.01); *H01F 27/022* (2013.01); *H01F 27/255* (2013.01); *H01F 27/2804* (2013.01); *H03H 1/0007* (2013.01); *H03H 7/00* (2013.01); *H03H 7/427* (2013.01); *H01F 2027/2809* (2013.01); *H03H 2001/0092* (2013.01)

(58) Field of Classification Search
CPC ........... H03H 7/427; H03H 2001/0085; H03H 1/0007; H03H 7/00; H01F 41/041; H01F 27/2804; H01F 27/022; H01P 27/255
USPC .................................. 333/185; 336/177, 200
See application file for complete search history.

(56) References Cited

U.S. PATENT DOCUMENTS

2013/0169381 A1  7/2013  Kim et al.
2014/0145814 A1  5/2014  Lee et al.
(Continued)

FOREIGN PATENT DOCUMENTS

JP  2007-242800 A  9/2007
JP  4793661 B2  10/2011
(Continued)

OTHER PUBLICATIONS

Korean Notice of Office Action dated Nov. 24, 2015 issued in Korean Patent Application No. 10-2015-0012592 (English translation).

*Primary Examiner* — Rakesh Patel
(74) *Attorney, Agent, or Firm* — McDermott Will & Emery LLP

(57) ABSTRACT

A common mode filter includes a substrate; an insulating layer disposed on the substrate and including coil patterns, the insulating layer having a cavity disposed in a central portion therein; and a magnetic particle-resin composite layer including a core part filling the cavity and a cover part covering the insulating layer. The core part contains fine magnetic particles having an average particle diameter of 30 μm or less, and the cover part contains the fine magnetic particles having the average particle diameter of 30 μm or less and coarse magnetic particles having an average particle diameter greater than that of the fine magnetic particles.

14 Claims, 1 Drawing Sheet

(51) Int. Cl.
*H01F 27/28* (2006.01)
*H03H 1/00* (2006.01)
*H03H 7/42* (2006.01)
*H01F 27/02* (2006.01)
*H01F 27/255* (2006.01)

(56) References Cited

U.S. PATENT DOCUMENTS

2014/0152402 A1  6/2014 Lee et al.
2014/0333404 A1  11/2014 Bae et al.

FOREIGN PATENT DOCUMENTS

| JP | 2014-107559 A | 6/2014 |
| KR | 10-2013-0078110 A | 7/2013 |
| KR | 10-2014-0071770 A | 6/2014 |
| KR | 2015-0005292 A | 1/2015 |

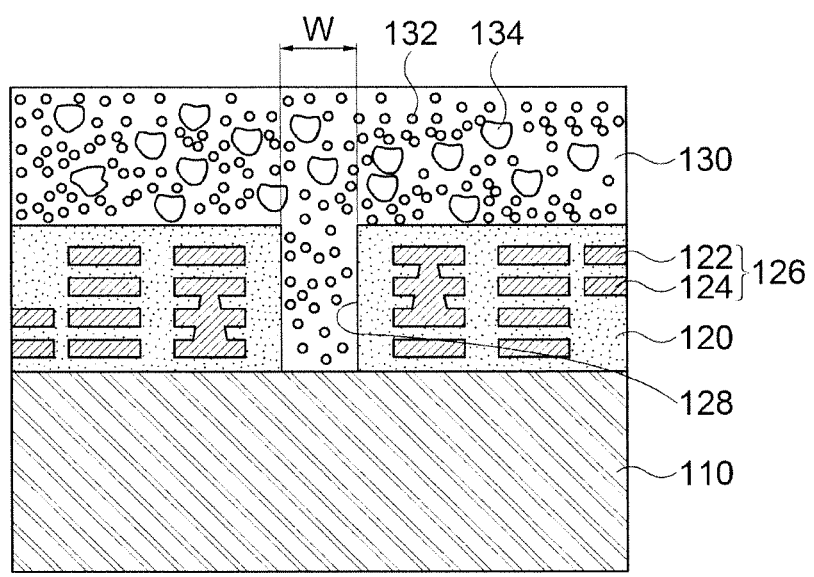

COMMON MODE FILTER AND METHOD OF MANUFACTURING THE SAME

CROSS-REFERENCE TO RELATED APPLICATION

This application claims the priority and benefit of Korean Patent Application No. 10-2015-0012592, filed on Jan. 27, 2015 with the Korean Intellectual Property Office, the entirety of which is incorporated herein by reference.

BACKGROUND

The present disclosure relates to a common mode filter and a method of manufacturing the same, and more particularly, to a common mode filter having improved impedance and a method of manufacturing the same.

In accordance with system configurations and increases in data capacity, high transmission rates have recently been required. A differential signal method is widely used as a fast transmission method.

Typically, when the frequency of a signal is converted to a high level in order to increase the transmission rate, unwanted electromagnetic waves, that is, noise, maybe generated by the signal having the high frequency, thereby causing a phenomenon in which the signal and noise overlap.

As a result, common mode noise occurs due to an imbalance between high speed differential signal lines, that is, two signal lines.

In order to remove common mode noise, a common mode filter is mainly used. Such a common mode filter is an electromagnetic interference (EMI) filter which is commonly used with high speed differential signal lines.

Common mode noise is generated by the differential signal line, and the common mode filter removes parts of noise that may not be removed by an existing electromagnetic interference filter. The common mode filter contributes to improving the electromagnetic compatibility (EMC) characteristics of home appliances, and the like or antenna characteristics of cellular phones, and the like.

However, when data is transmitted and received in a high frequency band, a GHz band, between a main device and a peripheral device in order to receive and transmit a large amount of data, a problem may occur in processing the data due to a delay of the signal and other interferences, as described above.

In particular, when various ports such as an image line, an acoustic signal line, and the like, are provided for use in a device such as a digital television (TV), problems such as delays in internal signal lines, transmission and reception distortion, and the like, as mentioned above, may more frequently occur.

An electromagnetic wave interference protection component, conventionally used to solve such problems, such as a common mode filter, has been manufactured as a wound type or a multilayer type common mode filter. In this regard, since such an electromagnetic wave interference protection component has a relatively large size and comparatively poor electrical properties, it may restrictively be applied to a circuit board having a relatively large area.

Furthermore, since many consumer electronic products are being made thinner, miniaturized, and given multiple functions while becoming ever more complex, electromagnetic wave interference protection components suitable for the above-mentioned conditions have been increasingly used. Wound-type or multilayer-type electromagnetic wave interference protection components for use in thinned and miniaturized electronic products have been manufactured, but since there are limitations in forming relatively complex internal circuits in a small area, the manufacturing of thin film-type common mode filter has recently been required.

SUMMARY

An aspect of the present disclosure provides a common mode filter securing a sufficient degree of impedance while having a relatively small size.

An aspect of the present disclosure also provides a method of manufacturing a common mode filter allowing a sufficient degree of impedance to be formed thereby while having a small size.

According to an aspect of the present disclosure, a common mode filter may include: a substrate; an insulating layer disposed on the substrate and including coil patterns, the insulating layer having a cavity in a central portion therein; and a magnetic particle-resin composite layer including a core part filling the cavity and a cover part covering the insulating layer, wherein the core part may contain fine magnetic particles having an average particle diameter of 30 μm or less, and the cover part may contain fine magnetic particles having an average particle diameter of 30 μm or less and coarse magnetic particles having an average particle diameter greater than that of the fine magnetic particles.

The substrate may be a magnetic substrate. The magnetic substrate may include ferrite.

The coil patterns may have a multilayer structure.

The cavity may have a diameter of 50 μm. The cavity may have an area of 0.00196 mm$^2$.

The average particle diameter of the coarse magnetic particles may be 40 μm or more.

According to another aspect of the present disclosure, a method of manufacturing a common mode filter may include: preparing a substrate; forming an insulating layer on the substrate, the insulating layer having a cavity in a central portion of the insulating layer and including coil patterns; forming a core part in the cavity; and forming a cover part covering the core part and the insulating layer. The core part may be formed to contain fine magnetic particles having an average particle diameter of 30 μm or less, and the cover part may be formed to contain fine magnetic particles having an average particle diameter of 30 μm or less and coarse magnetic particles having an average particle diameter greater than that of the fine magnetic particles.

The substrate maybe a magnetic substrate. The substrate may include ferrite.

The coil patterns may have a multilayer structure.

The cavity may have a diameter of 50 μm. The cavity may have an area of 0.00196 mm$^2$.

The average particle diameter of the coarse magnetic particles may be 40 μm or more.

BRIEF DESCRIPTION OF DRAWINGS

The above and other aspects, features and advantages of the present disclosure will be more clearly understood from the following detailed description taken in conjunction with the accompanying drawings, in which:

FIG. 1 is a schematic cross-sectional view of a common mode filter according to an exemplary embodiment in the present disclosure.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a schematic cross-sectional view of a common mode filter according to an exemplary embodiment in the present disclosure.

Referring to FIG. 1, a common mode filter may include a substrate 110, an insulating layer 120 having a cavity 128 in a central portion of the insulating layer 120 and including coil patterns 126 therein, and a magnetic particle-resin composite layer 130 including a core part filling the cavity 128 and a cover part covering the insulating layer 120. The core part of the magnetic particle-resin composite layer 130 may include a magnetic powder containing fine magnetic particles 132 having an average particle diameter of 30 μm or less, and the cover part of the magnetic particle-resin composite layer 130 may include a magnetic powder containing both fine magnetic particles 132 having an average particle diameter of 30 μm or less and coarse magnetic particles 134 having an average particle diameter greater than that of the fine magnetic particles 132.

The substrate 110 may be prepared. The substrate 110 may be a magnetic substrate. The magnetic substrate may include ferrite. When the substrate 110 is a magnetic substrate, the substrate may simultaneously serve to maintain or improve magnetic characteristics in the common mode filter.

The insulating layer 120 may be formed on the substrate 110. The insulating layer 120 may have the cavity 128 in the central portion of the insulating layer 120. The cavity 128 may be formed to have a diameter W of 50 μm. In this case, an area of the cavity 128 may be 0.00196 mm². In addition, the insulating layer 120 may include the coil patterns 126. The coil patterns 126 may include silver (Ag) or copper (Cu). The coil patterns 126 may include a primary coil 122 and a secondary coil 124. Here, the coil patterns 126 may include the primary coil 122 and the secondary coil 124 having a multilayer structure. In this case, layers of the coil patterns 126 may be connected to each other by a via. In a case in which a current flows in the coil patterns 126 having the above-mentioned structure, a magnetic field may be generated around the coil patterns 126, wherein magnetic fields generated by the primary coil 122 and the secondary coil 124 having the multilayer structure may overlap with each other to form the magnetic field. A magnetic flux of the magnetic field formed as described above may flow along the substrate 110 and the magnetic particle-resin composite layer 130.

End portions of each of the coil patterns 126 may be aligned with an edge of the substrate 110. Thus, when the magnetic particle-resin composite layer 130 covers the insulating layer 120 including the coil patterns 126, the cavity 128 formed in the insulating layer 120 may be filled with the magnetic particle-resin composite layer 130 so as to be used as the core part, and the end portions of each of the coil patterns 126 may be exposed to both end surfaces of the magnetic particle-resin composite layer 130 opposing each other.

The insulating layer 120 may be formed of a material including at least one of epoxy, polyimide (PI), polyamide (PA), and mixtures thereof. Alternatively, the insulating layer 120 may be formed by mixing a glass material and low temperature fired ceramic powder.

The magnetic particle-resin composite layer 130 may include the core part filling the cavity 128 formed in the insulating layer 120, and the cover part covering the insulating layer 120. The magnetic particle-resin composite layer 130 may be formed of the magnetic particles 132 and 134, and the resin. The magnetic particles 132 and 134 may include the fine magnetic particles 132 having an average particle diameter of 30 μm or less, and the coarse magnetic particles 134 having an average particle diameter greater than that of the fine magnetic particles. The magnetic particles 132 and 134 have different sizes so that the common mode filter may secure high permeability. The coarse magnetic particles 134 may have an average particle diameter of 40 μm or more. The core part may contain only the fine magnetic particles 132 having an average particle diameter of 30 μm or less, and the cover part may contain both the fine magnetic particles 132 having an average particle diameter of 30 μm or less and the coarse magnetic particles 134 having an average particle diameter greater than that of the fine magnetic particles 132. The common mode filter may obtain high permeability while maintaining high inductance at high current by the core part of the magnetic particle-resin composite layer 130.

Referring to the following Table 1, evaluation results as to whether or not voids are generated, depending on the diameter W (see FIG. 1) of the cavity 128 (see FIG. 1) formed in the insulating layer 120 (see FIG. 1) including the coil patterns 126 (see FIG. 1) and the average particle diameter of the magnetic particles 132 or 134 (see FIG. 1) of the magnetic particle-resin composite layer 130 (see FIG. 1) filling the cavity are illustrated.

TABLE 1

| Diameter of Powder Particles | Cavity Diameter (φ) | Area of Cavity | Void |
| --- | --- | --- | --- |
| 50 μm | 100 μm | 0.00785 mm² | No |
| 40 μm | 100 μm | 0.00785 mm² | No |
| 30 μm | 100 μm | 0.00785 mm² | No |
| 20 μm | 100 μm | 0.00785 mm² | No |
| 10 μm | 100 μm | 0.00785 mm² | No |
| 50 μm | 75 μm | 0.00415 mm² | Yes |
| 40 μm | 75 μm | 0.00415 mm² | Yes |
| 30 μm | 75 μm | 0.00415 mm² | No |
| 20 μm | 75 μm | 0.00415 mm² | No |
| 10 μm | 75 μm | 0.00415 mm² | No |
| 50 μm | 50 μm | 0.00196 mm² | Yes |
| 40 μm | 50 μm | 0.00196 mm² | Yes |
| 30 μm | 50 μm | 0.00196 mm² | No |
| 20 μm | 50 μm | 0.00196 mm² | No |
| 10 μm | 50 μm | 0.00196 mm² | No |

As illustrated in Table 1, when the diameter of the cavity was about 100 μm, voids were not generated. However, when the diameter of cavity was about 75 μm, and the average particle diameter of the magnetic particles was larger than 40 μm, voids were generated. In addition, even when the diameter of the cavity was about 50 μm, when the average particle diameter of the magnetic particles was larger than 40 μm, voids were generated.

As a result, when a size of the common mode filter is about 4 mm×3 mm, the diameter of the cavity formed in the insulating layer including the coil patterns may be about 50 μm. Thus, this disclosure provides a common mode filter and a method of manufacturing the same according to an exemplary embodiment capable of filling the cavity having the diameter of about 50 μm without the voids.

As set forth above, according to exemplary embodiments in the present disclosure, a common mode filter includes a core part filling a cavity formed in an insulating layer including coil patterns contains only the fine magnetic particles having an average particle diameter of 30 μm or less, and a cover part covering the insulating layer contains both fine magnetic particles having an average particle diameter of 30 μm or less and coarse magnetic particles having an average particle diameter greater than that of the fine magnetic particles. The core part may not include voids may and may have a width of about 50 μm. As a result, the common mode filter capable of securing sufficient impedance despite having a relatively small size may be provided.

In addition, in the common mode filter manufactured by the method according to the exemplary embodiment in the present disclosure, the core part filling the cavity formed in the insulating layer including the coil patterns is formed to contain only the fine magnetic particles having an average particle diameter of 30 μm or less. The cover part covering the insulating layer is formed to contain both the fine magnetic particles having an average particle diameter of 30 μm or less and the coarse magnetic particles having the average particle diameter greater than that of the fine magnetic particles. As such, the core part not including voids may be formed in the common mode filter including the cavity having a width of about 50 μm. As a result, the method of manufacturing the common mode filter capable of securing sufficient impedance despite a small size thereof may be provided.

While exemplary embodiments have been shown and described above, it will be apparent to those skilled in the art that modifications and variations could be made without departing from the scope of the present invention as defined by the appended claims.

What is claimed is:

1. A common mode filter comprising:
   a substrate;
   an insulating layer disposed on the substrate and including coil patterns, the insulating layer having a cavity disposed in a central portion therein; and
   a magnetic particle-resin composite layer including a core part filling the cavity and a cover part covering the insulating layer,
   wherein the core part contains fine magnetic particles having an average particle diameter of 30μm or less, and
   the cover part contains the fine magnetic particles having the average particle diameter of 30μm or less and coarse magnetic particles having an average particle diameter greater than that of the fine magnetic particles.

2. The common mode filter of claim 1, wherein the substrate is a magnetic substrate.

3. The common mode filter of claim 2, wherein the substrate includes ferrite.

4. The common mode filter of claim 1, wherein the coil patterns have a multilayer structure.

5. The common mode filter of claim 1, wherein the cavity has a diameter of 50μm.

6. The common mode filter of claim 1, wherein the cavity has an area of 0.00196 mm$^2$.

7. The common mode filter of claim 1, wherein the average particle diameter of the coarse magnetic particles is 40μm or more.

8. A method of manufacturing a common mode filter, the method comprising steps of:
   preparing a substrate;
   forming an insulating layer on the substrate, the insulating layer having a cavity in a central portion of the insulating layer and including coil patterns;
   forming a core part in the cavity; and
   forming a cover part covering the core part and the insulating layer,
   wherein the core part is formed to contain fine magnetic particles having an average particle diameter of 30μm or less,
   the cover part is formed to contain the fine magnetic particles having the average particle diameter of 30μm or less and coarse magnetic particles having an average particle diameter greater than that of the fine magnetic particles.

9. The method of claim 8, wherein the substrate is a magnetic substrate.

10. The method of claim 9, wherein the substrate includes ferrite.

11. The method of claim 8, wherein the coil patterns have a multilayer structure.

12. The method of claim 8, wherein the cavity has a diameter of 50μm.

13. The method of claim 8, wherein the cavity has an area of 0.00196 mm$^2$.

14. The method of claim 8, wherein the average particle diameter of the coarse magnetic particles is 40μm or more.

* * * * *